United States Patent [19]

Asai et al.

[11] 4,327,484
[45] May 4, 1982

[54] APPARATUS FOR INSERTING ELECTRONIC COMPONENTS TO A PRINTED CIRCUIT BOARD

[75] Inventors: Koichi Asai, Nagoya; Tousuke Kawada, Chiryu, both of Japan

[73] Assignee: Fuji Mfg. Co., Ltd., Chiryu, Japan

[21] Appl. No.: 119,392

[22] Filed: Feb. 7, 1980

Related U.S. Application Data

[62] Division of Ser. No. 936,578, Aug. 22, 1979, Pat. No. 4,215,469.

[30] Foreign Application Priority Data

Sep. 29, 1977 [JP] Japan .................. 52-117227
Oct. 12, 1977 [JP] Japan .................. 52-122159
Nov. 7, 1977 [JP] Japan .................. 52-133189

[51] Int. Cl.³ .......................................... B23P 19/00
[52] U.S. Cl. .......................................... 29/741; 29/739
[58] Field of Search ............... 29/741, 739, 747, 40, 29/832, 760, 838, 566.3; 140/1, 105, 930; 227/155

[56] References Cited

U.S. PATENT DOCUMENTS 2,964,749 12/1960 Kwasniewski et al. ............ 227/155
3,429,170  2/1969 Romeo ............................... 29/741 X
3,435,857  4/1969 Ragard et al. ..................... 29/741 X
3,800,416  4/1974 Shultz, Jr. et al. ................ 29/739 X
3,986,533 10/1976 Woodman, Jr. ................... 29/566.3 X
4,051,593 10/1977 Mori et al. ......................... 29/741 X
4,054,988 10/1977 Masuzima et al. ................ 29/741 X
4,080,730  3/1978 Woodman, Jr. ................... 29/741 X
4,196,513  4/1980 Harigane et al. .................. 29/837 X Primary Examiner—Francis S. Husar
Assistant Examiner—Carl Arbes
Attorney, Agent, or Firm—Browdy and Neimark

[57] ABSTRACT

An apparatus for inserting electronic components into a printed circuit board including (a) chucking means for holding a pair of lead wires of an electronic component, which chuck opens and closes in a direction perpendicular to a plane including the axes of the pair of lead wires; with a distance identical to that between the lead wire inserting holes in the printed circuit board; (b) means for inserting thus held lead wires into a corresponding pair of lead wire inserting holes; and (c) means for applying a clinching treatment to the inserted lead wires protruding from the back side of the printed circuited board, whereby an electronic component is, regardless of the size of the inter-lead-wire distance, held by a chuck such that one of the lead wires is located at a certain preset base position biased to either side of the chucking surface of the chuck, and the printed circuit board and the chuck are relatively positioned when the lead wires held by the chuck are about to be inserted, and such that the components, when the lead wires have been inserted, are positioned beside the side edge of the chuck against which the component is biased.

14 Claims, 39 Drawing Figures

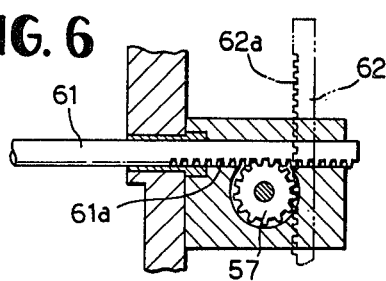
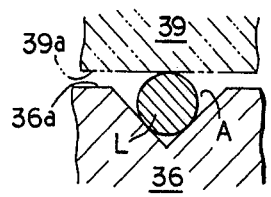
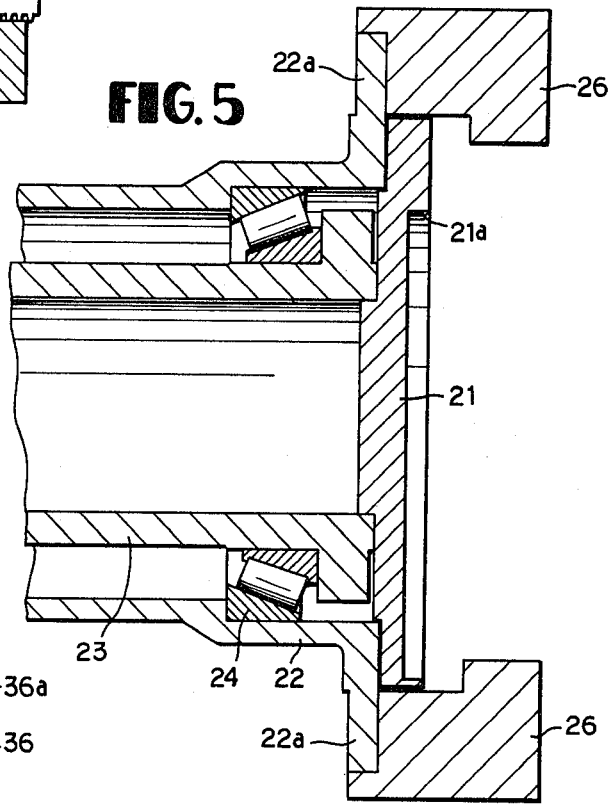
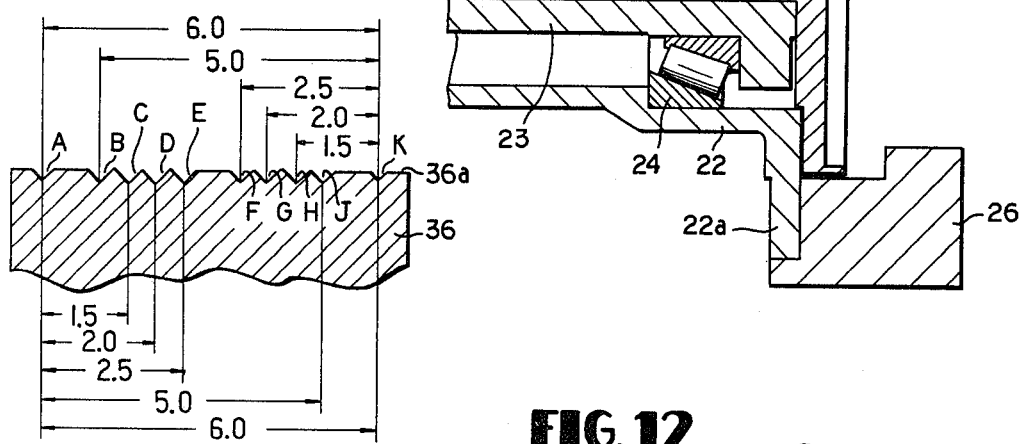
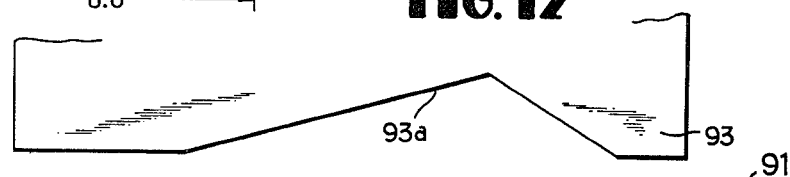
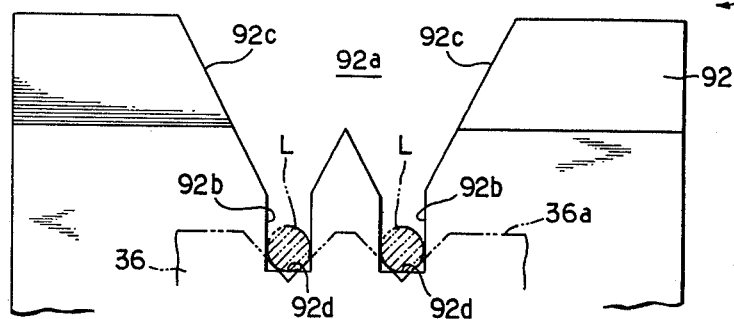

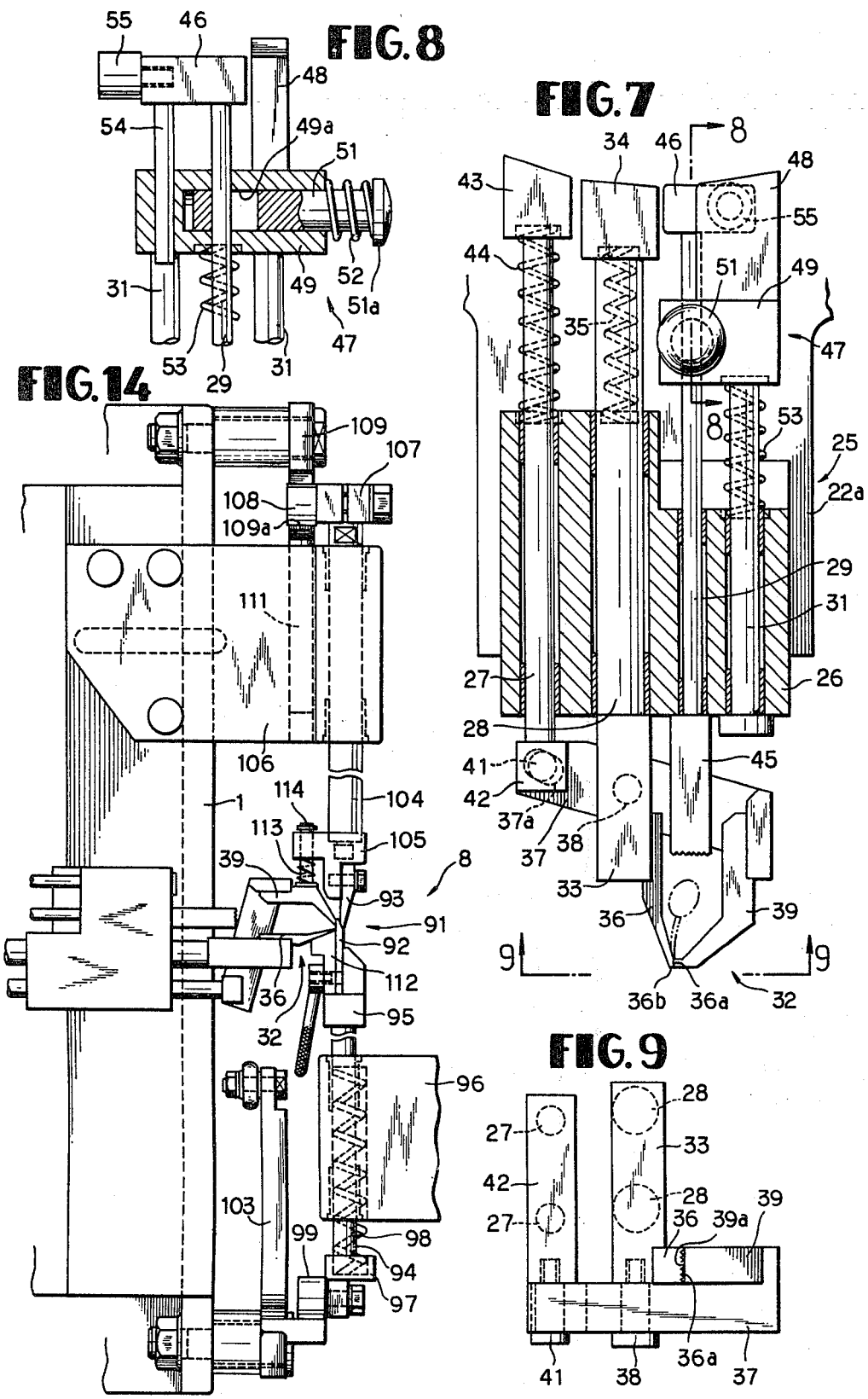

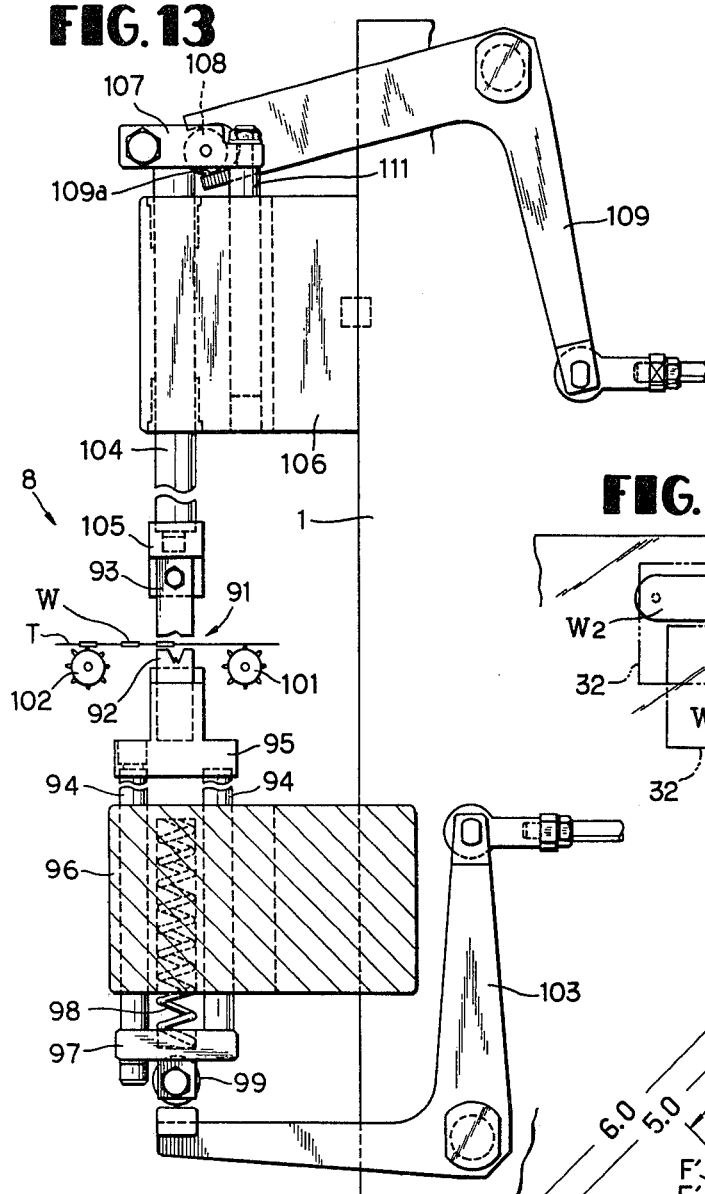
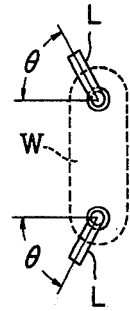
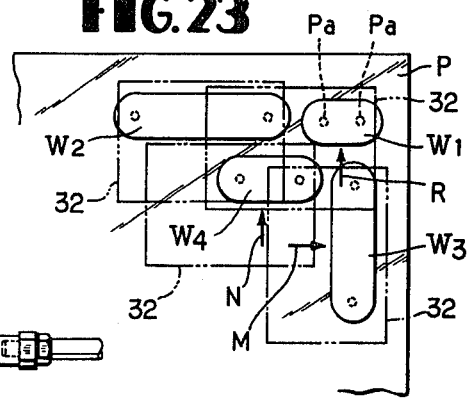
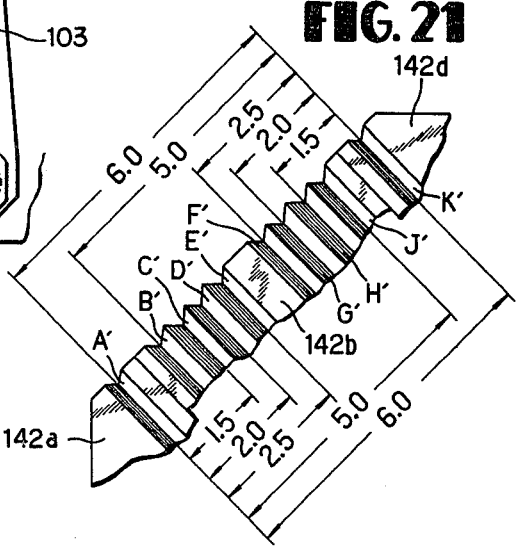
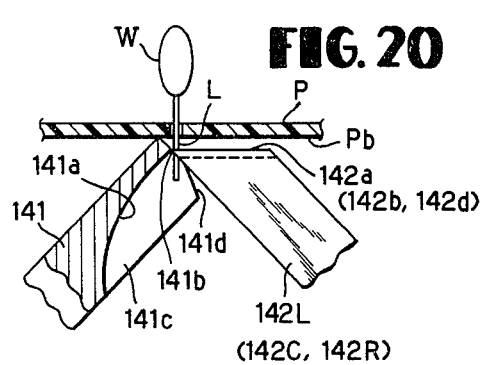

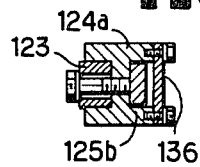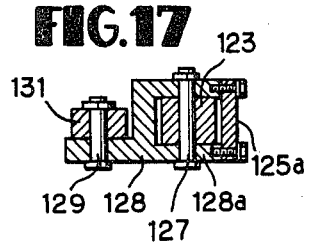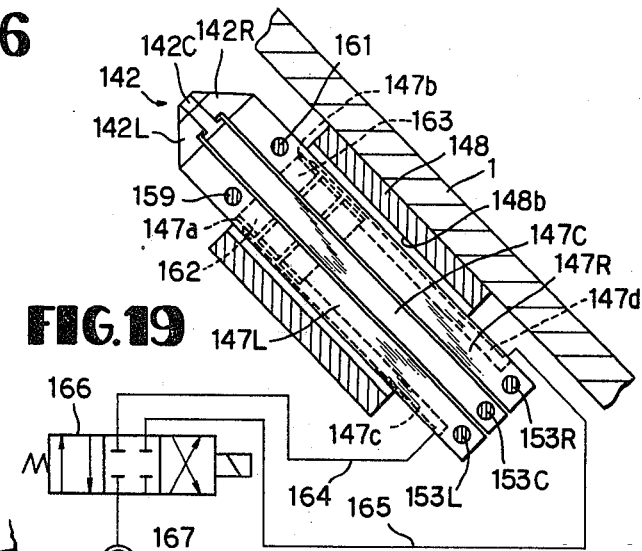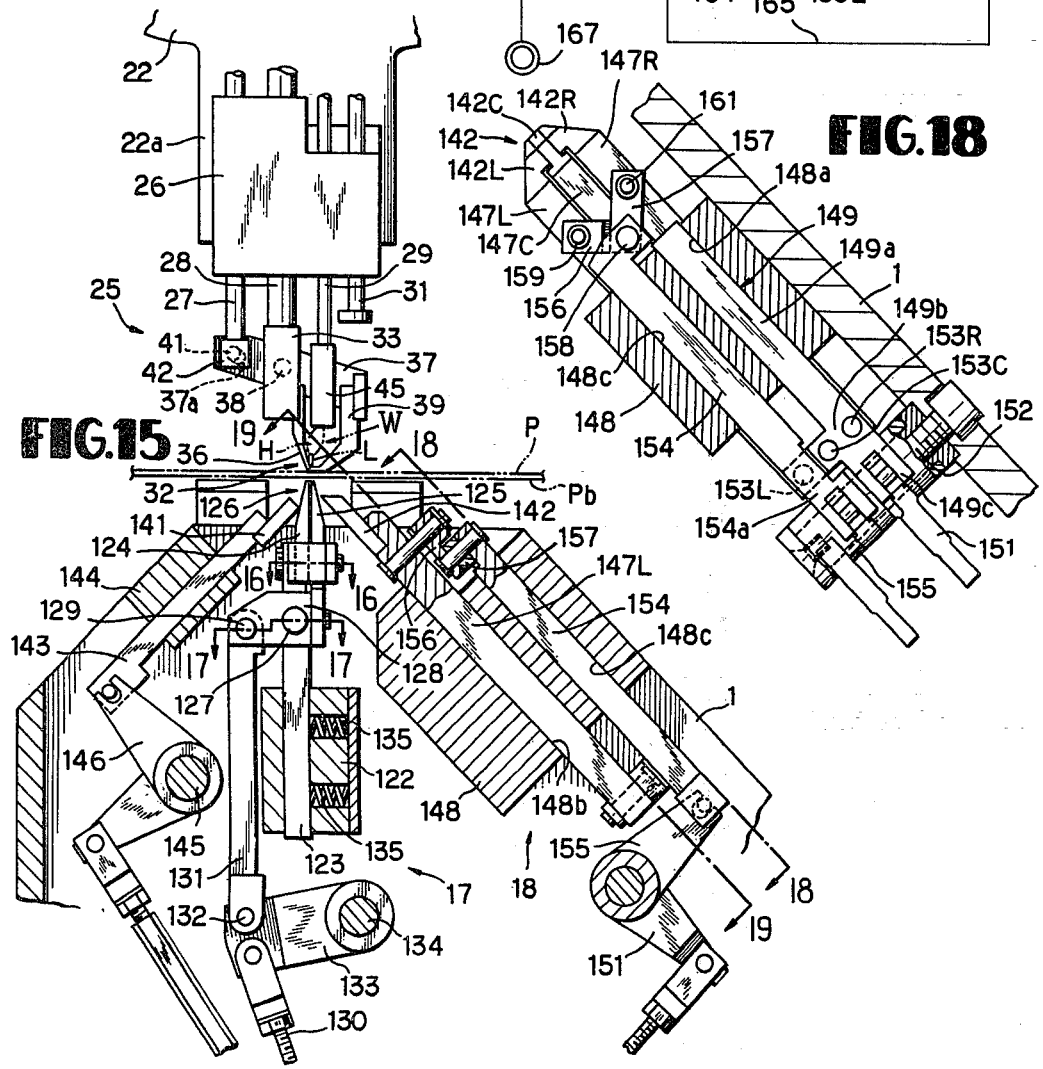

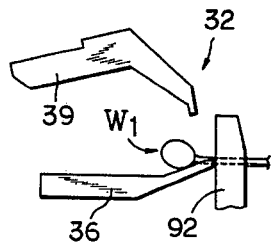
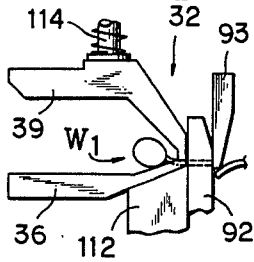
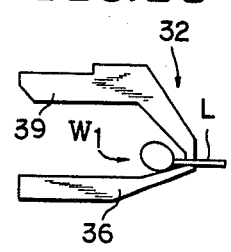
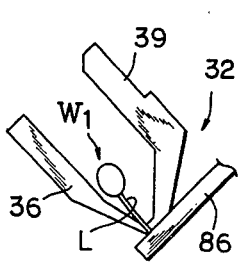
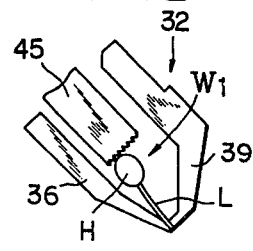
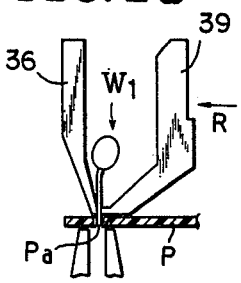
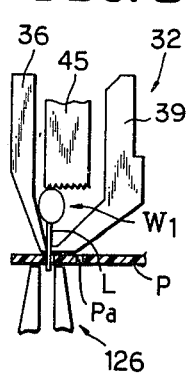
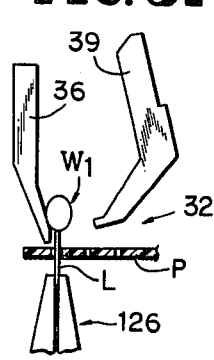
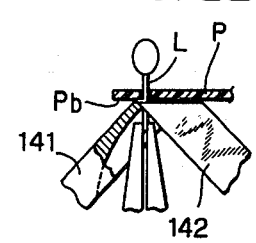
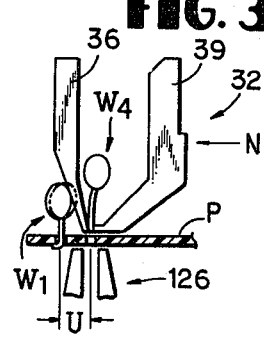

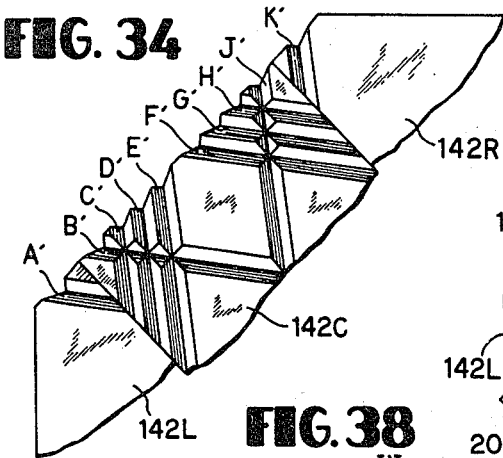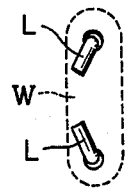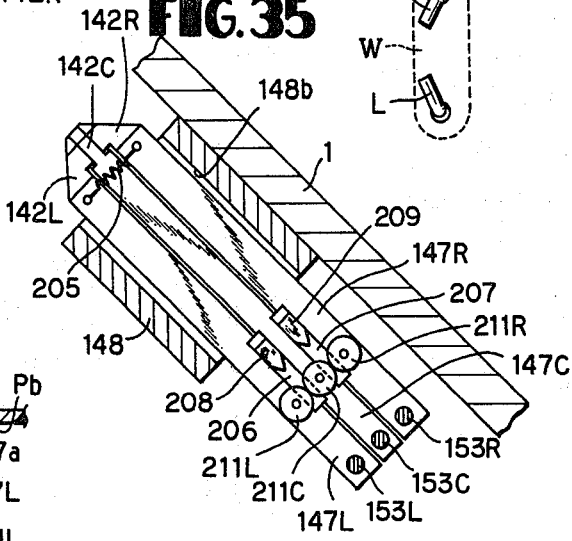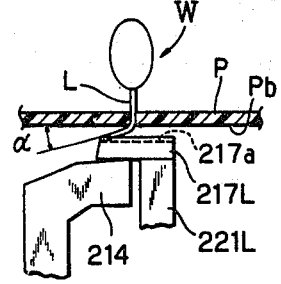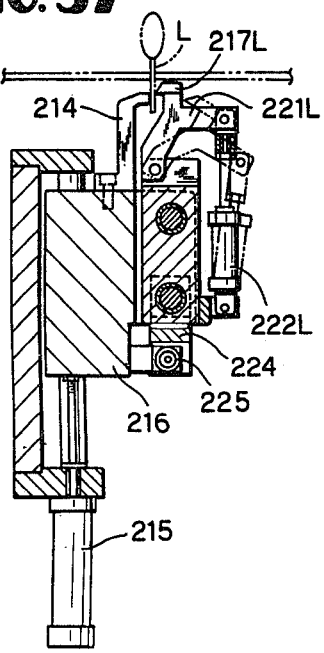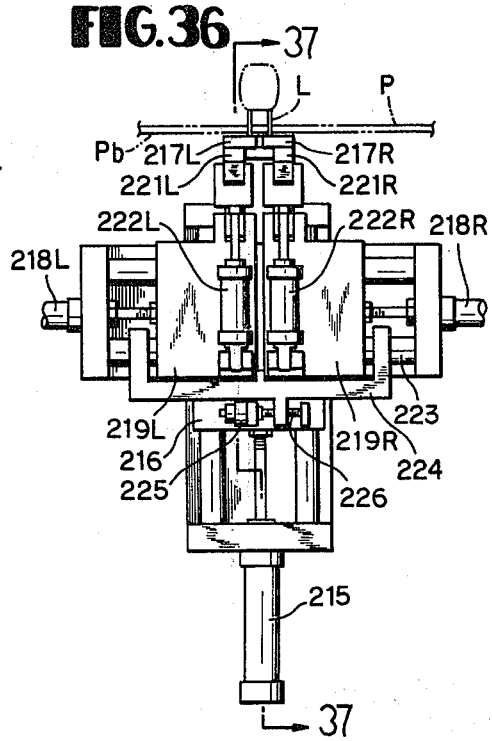

APPARATUS FOR INSERTING ELECTRONIC COMPONENTS TO A PRINTED CIRCUIT BOARD

This is a division of application Ser. No. 936,578 filed Aug. 22, 1979, now U.S. Pat. No. 4,215,469, issued Aug. 5, 1980.

BACKGROUND OF THE INVENTION

The present invention relates to a method of inserting and fixing or clinching electronic components (hereinafter called component) to a printed circuit board (hereinafter called p-c-b for short) and an apparatus for practically realizing the method.

The general process order of inserting or planting components to a p-c-b is (a) inserting a pair of lead wires of a component into lead wire inserting holes (hereinafter called simply inserting holes) formed, large in number, over the surface of a p-c-b; (b) bending or clinching a portion of the lead wires protruded to the back of the p-c-b, passing through the holes, for preventing the same from coming off; and then soldering the lead wires to the conductive circuit arranged on the p-c-b.

Recently developed automatic planting methods of components and apparatuses therefor have greatly contributed to the rationalization of assemblying lines, not only in the field of household electrical appliances such as television sets, audio apparatuses, etc., but also in the field of industrial instruments and machines. Most of the conventionally utilized means or apparatuses for this purpose have been, however, based on employing of an inserting guide having tapered guide holes or inclined guide grooves. After a component-to-be-inserted having been moved to targeted holes by a separate means such as a chuck or a pusher, the tip of the lead wires of the component-to-be-inserted are guided to the targeted inserting holes by the above-mentioned inserting guide. These inserting guides are mostly usable for only one type of component having a specific lead wire gage (the distance between the two lead wires). In actuality, the lead wire gage is of much variety, such as 1.5, 2.0, 2.5, 5.0, 6.0 mm—(there are many standardized dimensions). In the conventional way of planting the components on the p-c-b, one type of components of a specific gage have to be planted first, scatteringly with much interval, and another type of components of a different gage must be planted with another inserting guide between the already planted components. Such being the case, components-to-be-inserted of different gage dimension require changing inserting guides every time according to the size of the components one by one sporadically over the surface of the p-c-b, seeking enough space available for the planting operation. The more the planting stage advances, i.e., as the planting operation progresses, the harder becomes the planting operation, because the p-c-b surface is filled with the already planted components, requiring seeking space in the scantily left area. In other words, the conventional way of planting is faulty in that it is inefficient in its operation because of the need to change the guide often and seeking an operation space with difficulty, and that consequently the distribution density of planting is comparatively low. For some components of so-called axial type wherein the lead wires are extending axially from either side of a component, a device which is disclosed by the Japanese Published Examined patent application No. 49 (1974)-7936, is known. This device is able to plant or insert the lead wires bent at a right angle, even when the gage or distance of the lead wires are different in several dimensions. This device is composed of two parts for inserting respectively the right side wire and the left side wire, and is obliged to be complicated in its construction, because it aims at planting components of different gage by means of adjusting the distance between the two parts of the device itself. Such a device is a step progress indeed, but it is too expensive because of its sophisticated structure, to be generally utilized, and still leaves something to be desired because of its non-applicability to components of so-called radial type wherein the lead wires are extending parallelly at one side of a component. This invention has been made from such a background.

It is therefore a primary object of this invention to provide a technological art of inserting for fixing a plurality kinds of components, different respectively in the lead wire gage, at as high a distribution density as possible, into the inserting holes in a p-c-b.

It is another object of this invention to provide a technological art of inserting for fixing a plurality of kinds of components, different respectively in the lead wire gage, with a desired order, into the inserting holes in a p-c-b.

This invention, in order to fulfill the above-mentioned objects, is aimed at (a) chucking the two lead wires of a component by means of a chuck, which is open and closable between the two pawls thereof in a perpendicular direction to a plane determined by the two lead wires, with a distance identical to that between a pair of lead wire inserting holes formed in the p-c-b; (b) letting the lead wires protrude from the chuck by means of a separately disposed pusher, or approaching the chuck itself with the lead wires held to the p-c-b; and (c) inserting the lead wires into the inserting holes and clinching the projected portion of the lead wires to the back side of the p-c-b by bending or squashing.

Regarding this chucking operation of the lead wires there are several unprecedented devices applied here. One of which is, in chucking a variety or plurality of kinds of components having respectively different wire gage indiscriminately, to chuck one of the lead wires at a preset base position of the chuck biased to either one edge of the chucking surface thereof (selectable either one edge from both edges). When the inserting is about to take place, the p-c-b is rightly positioned relative to the chuck such that the already planted component just comes to the side of the very edge of the chuck at which edge the lead wires of the component-to-be-inserted are held. In case of chucking and inserting such lead wires by a chuck, which is open-and closable in a direction perpendicular to the plane including the two lead wires, a chuck having a width of the chucking portion wider than the widest lead wire gage of the components, is able to cover all the components-to-be-planted. Such a chuck would be too big in size, when used for planting comparatively small sized components of narrower gage, and consequently requires too much useless space around the components. It would also produce another problem of degrading the distribution density of component planting. This invention has solved this knotty problem by a principle that the chucking of lead wires is always done by holding a pair of lead wires at either one or exclusively one biased edge portion of the chuck, instead of holding at the central portion thereof, and by always letting this biased edge portion approach the already planted component through an appropriate relative positioning of the chuck and the p-c-b. By means of such an arrangement of the chuck, the portion thereof where it does not hold the lead wires is always positioned above a non-planted area of the p-c-b, which provides no disadvantageous conditions with respect to distribution density. Although this invention was made focusing on planting of the components of radial type, it may be applicable to those of axial type, too, so long as the lead wires (or one of the lead wires) are bent in advance to extend parallelly with a preset distance to each other.

BRIEF DESCRIPTION OF THE DRAWINGS

FIG. 5 is a vertical cross-section showing the engagement of the cam plate (21) and the index table;

FIG. 6 is a vertical cross-section of a part of FIG. 4 taken along the section line 6—6;

FIG. 7 is an enlarged elevation (partly in cross-section) of the chucking-system on the turret loader (9);

FIG. 8 is a cross-section of a part of FIG. 7 taken along the section line 8—8;

FIG. 9 is a projection, seen from the line 9—9, of the chucking-system of FIG. 7;

FIG. 10 is an enlarged transverse cross-section of V-grooves formed on a fixed pawl of the chuck (32) of FIG. 7;

FIG. 11 is an explanatory view showing how a lead wire (L) of a component is held in a V-groove of FIG. 10;

FIG. 12 is an enlarged elevation of an essential portion of the cutter (91) in FIG. 13 on the component supplying means (8) shown in FIG. 3;

FIG. 13 is an elevation of the component supplying means 8 shown in FIG. 3;

FIG. 14 is a side view of the same (FIG. 13);

FIG. 15 is an elevation (partly in section) of the drawing-in mechanism (17) and the clinching means (18) shown in FIG. 3;

FIG. 16 is a cross-section of a part of FIG. 15 taken along the section line 16—16;

FIG. 17 is a cross-section taken along the section line 17—17 of FIG. 15;

FIG. 18 is a cross-section taken along the section line 18—18 of FIG. 15;

FIG. 19 is a cross-section taken along the section line 19—19 of FIG. 15;

FIG. 20 is an enlargement of elevation (partly in section) of the stationary blade (141) and the movable blade (142) of FIG. 15;

FIG. 21 is an enlarged plan view of the upper side of the movable blade (142) shown in FIG. 15;

FIG. 22 is an enlarged explanatory view of the lead wires (L) clinched by the clinching means (18) shown in FIG. 15;

FIG. 23 is an explanatory view to show in what layout and how the components are planted;

FIGS. 24–33 are explanatory views to show the inserting operation in order;

FIG. 34 is another embodiment of the movable blade corresponding to FIG. 21;

FIG. 35 is another embodiment of the clinching means corresponding to FIG. 19;

FIG. 36 is an elevation of still another embodiment of the clinching means;

FIG. 37 is a cross-section of the clinching means of FIG. 36 taken along the section line 37–37;

FIG. 38 is an explanatory view illustrating the operation of the clinching means shown in FIG. 37;

FIG. 39 is an explanatory view of the lead wires (L) clinched by another embodiment of the clinching means (correspond to FIG. 22).

DETAILED DESCRIPTION OF THE PREFERRED EMBODIMENTS

CONSTRUCTION

Figure 1:
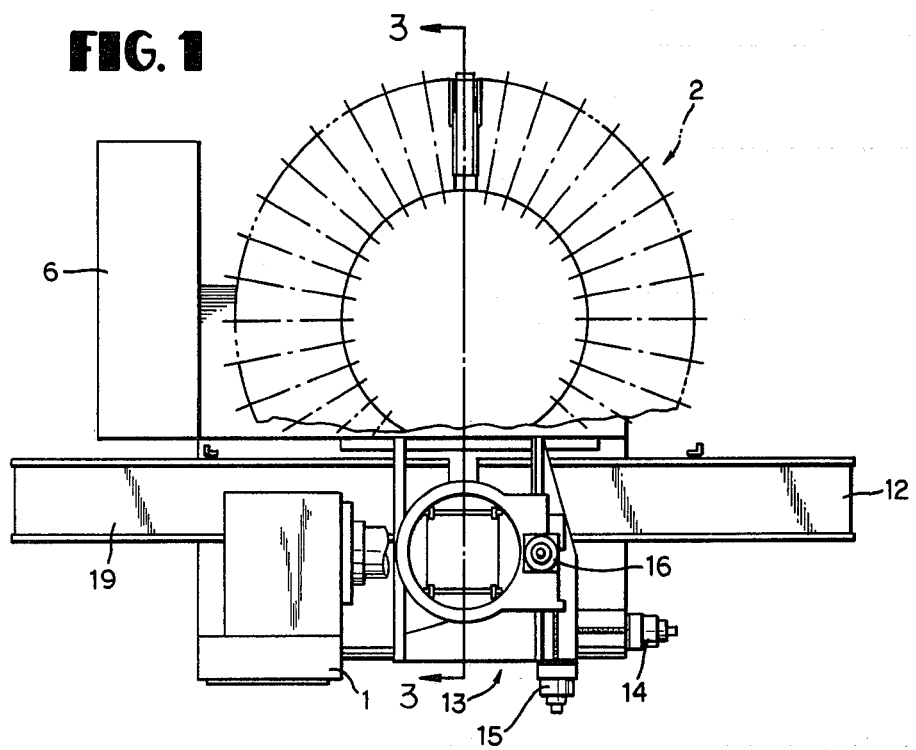
FIG. 1 is a schematic general plan view of an embodiment of an inserting system according to this invention.
Figure 2:
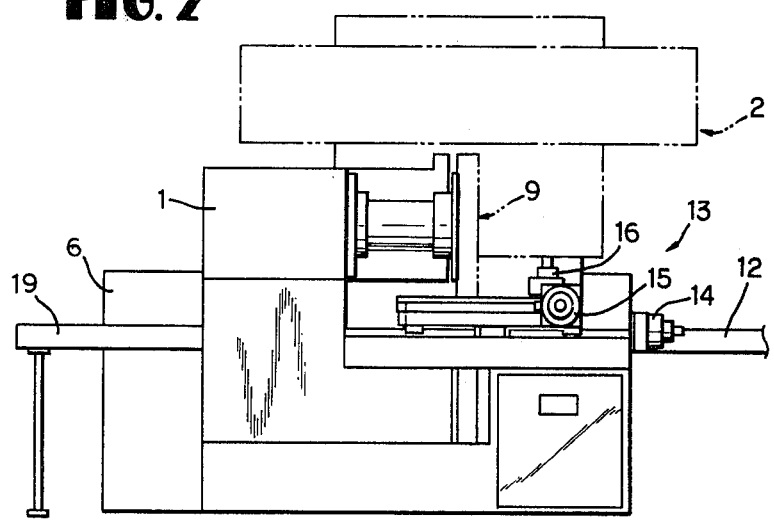
FIG. 2 is a schematic general elevation view of the same.
Figure 3:
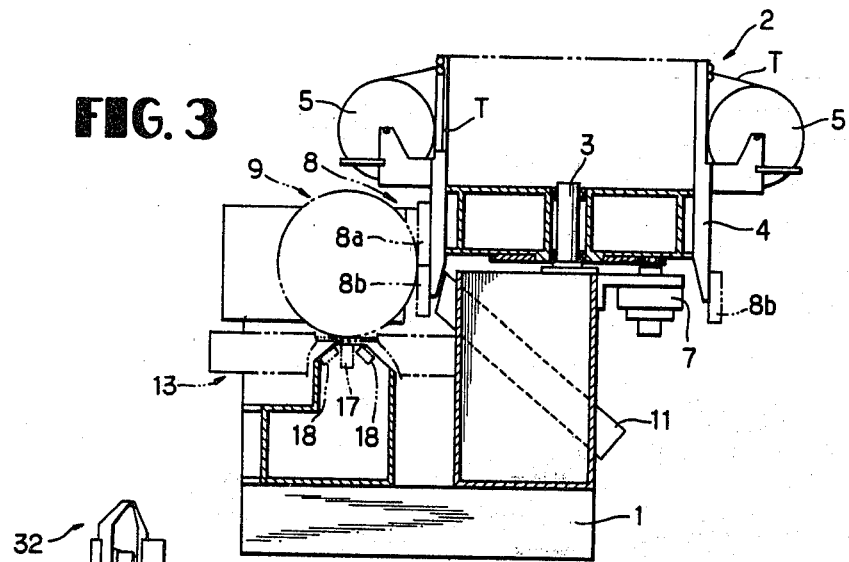
FIG. 3 is a cross-sectional view of the embodiment of FIG. 1 taken along the section line 3—3.

The lead wire inserting system as a whole will be described, particularly concerning the layout of each mechanism referring to FIGS. 1-3, followed by a detailed structural explanation of each mechanism one by one. In these FIGS. 1-3, the complicated mechanism of each part is purposely shown only by designating the laid out position thereof by the two-dot-chain lines. Numeral 1 designates a main body of the inserting system, above but back-off of which is positioned a magazine means 2, which is provided with a rotatable frame 4 supported by a supporting rod 3. On the outer periphery of the rotatable frame 4 are attached a plurality of reels 5 (in this embodiment 36 in number) for retaining rolled tapes, on which a number of electronic components are stuck at their lead wire portions. The frame 4 is rotated by a servomotor 7, under command signals from a control panel 6. When a given reel 5 is positioned at a component supplying position, a tape T drawn out of the reel 5 is delivered to a component supplying means 8, wherein components are fed to a turret loader 9 after having been cut at their lead wire portions stuck to the tape T. The tape T left behind is discharged through a chute 11, to the rear of the main body 1. The component supplying means 8 is divided into two principal parts, a stationary part 8a and a movable part 8b, the former being fixed to the main body 1 and the latter being attached to the rotatable frame 4 in the same number as the reels 5.

A p-c-b, on which components are to be planted, is conveyed by an in-conveyer 12 for being fixed to a positioning means 13 by means of a well known loading means (not shown). The positioning means 13 is provided with two feeding servomotors 14 and 15 in X and Y axial directions, and with a third servomotor 16 for rotation, all of which serve to position the p-c-b at a predetermined position under the command signals from the control panel 6. When the tips of the lead wires of a component which has been conveyed, by the turret loader 9 from the component supplying means 8 are inserted into targeted inserting holes in the p-c-b just rightly positioned, a drawing-in mechanism 17 and a clinching means 18 are actuated in succession for pulling in the lead wires to be cut or sheared at a certain appropriate length and bending them to be fixed not to come off until they are nearly parallel to the back side of the p-c-b. A p-c-b planted fully with the predetermined number of components, at a predetermined layout, will be removed therefrom by means of a well-known unloading means (not shown) for being conveyed away by means of an out-conveyor 19.

Essential parts of each means mentioned above will be elaborated hereunder.

Figure 4:
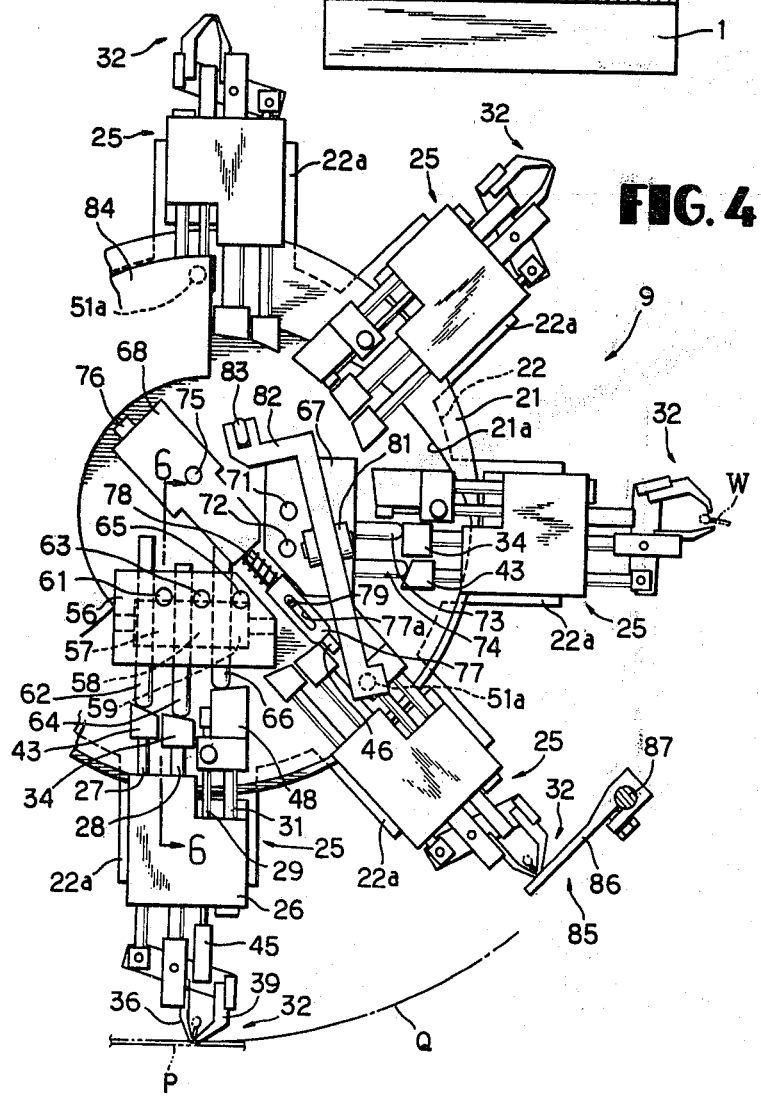
FIG. 4 is an enlarged elevation of an essential portion of the turret loader (9) in FIG. 3.

As can be seen in FIGS. 4 and 5, (the former being an elevational enlargement of a turret loader 9 and the latter being a vertical cross-section thereof for showing the connection of an index table and a cam plate), an index table 22 is supported, via bearing 24, by a supporting cylinder 23, and a cam plate 21 having a cam surface 21a for retracting a pusher (described later in detail) and is secured to the supporting cylinder 23. The index table 22 may be rotated by any ordinary intermittent rotary mechanism (indexing means) intermittently by ⅛ round (45°) each time. Index table 22 is provided with eight radially projected portions 22a, with an equal circumferential angular distance to each other, having respectively a chuck retainer 25 mounted on it, eight in all. Each chuck retainer 25 is provided with a guide block 26 secured to the projected portion 22a and a plurality of rods 27, 28, 29, and 31 slidably fitted, in an axial direction, in the guide block 26, and supports at the tip thereof a chuck 32.

Referring to FIGS. 7-11 further description on this part of the apparatus will be made.

A pair of rods 28, as shown in FIGS. 7 and 9 are connected at the tip (lower portion in FIG. 7) by a block 33 and at the end thereof (upper portion in FIG. 7) by a connecting block 34; between the latter 34 and the guide block 26 is mounted a compression spring 35 for constantly biasing, via the connecting block 34, the rods 28 toward the end thereof.

On the block 33 is firmly attached a stationary or fixed pawl 36 of the chuck 32, which stationary pawl 36 is preferable as thin and straight in configuration as possible and provide with, on its lead wire chucking surface 36a, V-shaped (in section as shown in FIG. 10) guide grooves A, B, C, D, E, F, G, H, J, and K formed thereon.

These guide grooves, A—K, are all to be formed perpendicularly to the tip surface 36b of the stationary pawl 36 to such a depth that a small part of the circumferential surface of a lead wire L chucked therein can be out of the groove beyond the groove upper level as shown in FIG. 11. The grooves C, D, E, J, and K are respectively formed with a respective distance from the groove A, biased or put aside to one edge, 1.5, 2.0, 2.5, 5.0, and 6.0 mm; on the other hand, the grooves H, G, F, B, and A are all respectively formed similarly, with a respective distance from the groove K, biased to the other edge, 1.5, 2.0, 2.5, 5.0, and 6.0 mm. The above-mentioned arrangement of the grooves is aimed at allowing either edge of the chucking surface 36a of the stationary pawl, i.e., either the rightly biased or leftly biased edge portion, to be employed according to the circumstances of the already planted (or inserted) components $W_1$ and/or inserting holes. In other words, the chuck 32 can hold the lead wires L at its rightwardly biased edge portion or leftwardly biased edge portion freely selecting the suitable side according to the situation of the already planted components $W_1$ and the targeted inserting holes. On the block 33 is pivoted a lever 37 with a pin 38, and on one end of this lever 37 is fixed a movable pawl 39 of the chuck 32. The chuck 32 is open-and closable, owing to rotation of the movable pawl 39 together with the lever 37 about the pin 38, for chucking or holding the lead wires L between the grooves, A-K, formed on the stationary pawl 36 and the chucking surface 39a of the movable pawl 39. The opposite end of the lever 37, from one where the movable pawl 39 is fixed, is connected with a pin 41 to a block 42 which is secured to the tip of a pair of rods 27 (lower portion in FIG. 7). The pin 41 passes through an elongated hole 37a formed in the lever 37, and is secured to the block 42. The pair of rods 27 are at their tip portion connected by the block 42 (lower in FIG. 7) and at the end portion connected by a connecting block 43 (upper in FIG. 7). Between the connecting block 43 and the guide block 26 is disposed a compression spring 44 for constantly biasing the rods 27, via the connecting block 43, toward the end portion (upward in FIG. 7).

Between the stationary pawl 36 and the movable pawl 39 is disposed a pusher head 45, which is secured to the tip of a rod 29. By means of urging a connecting block 46, which is connected to the end portion of the rod 29 (upper portion in FIG. 7), the pusher head 45 can be moved downwards, in FIG. 7; it is also, through connection with a clutch means 47, connected to a connecting block 48. The clutch means 47 comprises, as shown in FIG. 8, a clutch body 49 secured to the end portion of a pair of rods 31, which are guided by the guide block 26, a piston 51 slidably fitted in a bore 49a formed in the clutch body 49, and a compression spring 52 mounted between the head 51a of the piston 51 and the clutch body 49. The elastic force of the compression spring 52 serves to connect the rod 29 and a connecting block 48 with the aid of the frictional force generated among the clutch body 49, the piston 51, and the rod 29 passing through these members. The clutch means 47 itself is biased upward (in FIG. 7) by a compression spring 53 disposed between the clutch body 49 and the guide block 26. As a guide rod 54, which is connected to the connecting block 46, is slidably fitted through the clutch body 49, rotation of the connecting block 46 and the rod 29 and that of the pusher head 45 about the axial line are all restricted. On the connecting block 46 is pivoted a cam follower 55.

The operative parts of a chucking mechanism composed of the chuck retainer 25 and the chuck 32 will be described hereunder.

The cam plate 21 is, as shown in FIG. 4, provided with a pinion housing 56 firmly fixed, in which three pinions 57, 58, and 59 are rotatably, independent to each other, mounted. As shown in FIG. 6, on the cogs of the pinion 57 rack portions 61a and 62a of two push rods 61, 62 are engaged; when the push rod 61 is rightwardly moved by a cam (not shown), which is in interlock relation with the rotation mechanism of the index table 22, the push rod 62 is downwardly shifted by the same distance as that in the former. As to the other pinions 58 and 59 the description holds true quite identically; push rods 63 and 64, and the push rods 65 and 66 are respectively moved the same distance, changing the direction of the movement by 90°. In other words, the role of the pinion housing 56 is to transfer or deliver the movement of the push rods 61, 63, and 65, disposed in and parallel to the axis of the supporting cylinder 23, which movement is imparted by a cam (not shown, but disposed to the left of the supporting cylinder 23 in FIG. 5), to the push rods 62, 64, and 66, upon changing the direction of the movement by 90°, which will in turn become the urging force to be imparted to the connecting blocks 43, 34, and 48 through the abutting thereon. On the cam plate 21 are secured other two pinion housings 67 and 68, being of similar construction to the pinion housing 56, in which a similar movement transfer is respectively carried out, from the push rods 71 and 72 to the push rods 73 and 74 and further from the push rod 75 to the push rod 76. The push rods 73 and 74 respectively abuts on the connecting block 34 and 43 to urge the same; on the tip of the push rod 76 is slidably fitted a cylindrical pusher 77 with a bottom, which is constantly biased in the projecting direction by a compression spring 78 and restricted at the same time of a projection beyond a certain limit through the engagement of a pin 79 and an elongated hole 77a. The urging force of the push rod 76 is transferred or delivered, via the compression spring 78 and the cylindrical pusher 77, to the connecting block 46.

On the pinion housing 67 is secured a bracket 81, on which a clutch releasing lever 82 is, at its middle portion, pivoted. One end of the clutch releasing lever 82 is positioned just confronted to the head 51a of the piston 51 fitted in the clutch 47, the other end thereof being pivoted to a push rod 83.

On the cam plate 21 is also attached a clutch releasing plate 84 of sector configuration, just at a position to be interferred with the head 51a of the piston 51. When the piston 51 is rotated caused by the rotation of the index table 22, the contact of the piston head 51a with the clutch releasing plate 84 will cause the release of the clutch means 47. The inner cam surface 21a of the cam plate 21 is so configurated as to contact, at this time, with the cam follower 55 pivoted on the connecting block 46 to cause the cam follower 55, the connecting block 46, the rod 29, and the pusher head 45 to move toward the axial line of the index table 22, i.e., to draw back radially toward the axial line thereof.

The turret loader 9 is further provided with a lead wire pushing back means 85, which is disposed, as shown in FIG. 4, at a south-east position (lower right direction) along the circumferential line of the turret loader 9, and composed of a pushing-in lever 86 and an operation shaft 87, which is actuated by a not-shown mechanism to oscillate the pushing-in lever 86 at a preset time by a preset angle. This lead wire pushing back means 85 functions, when the chuck 32, which is holding the middle portion of the lead wires L, is halted at a obliquely lower right position, to push back the projected portion of the lead wires L out of the tip level of the chuck 32 therewithin.

The work or component supplying means 8 must be described next, which functions to separate electronic components one by one from a tape T which has been taken off the reel 5 of the magazine means 2 for supplying them to the turret loader 9. This supplying means 8 concurrently operates as a position conforming means so as to conform the position of supplying the lead wires L of the component W to the chuck 32 of the turret loader 9 exactly with the position of the commanded pair of guide grooves formed on the chuck 32, among A to K, under the signals from the control panel 6.

Although the magazine means 2 is, under the command of the control panel 6, actuated by the servomotor 7 in order to supply the tapes T, which retain respectively one type of components, according to the order of the components to be planted on the p-c-b P, at an exactly conformed position with the chuck 32, the lead wires L of the components-to-be-planted do not rightly agree with the guide grooves, A to K, on the chuck 32, because the lead wires L are more or less bent in general. It is therefore required to exactly conform the position or posture of the lead wires L with the guide grooves, A to K, formed on the chuck 32 for letting the same firmly hold the lead wires L as they are, before cutting the lead wires L to take the component off the tape T. In this embodiment a lead wire cutter 91 in FIG. 12 is so designed as to work concurrently as the position conforming means, which is composed of two blades, a first 92 and a second 93, for shearing in mutual cooperation the lead wires L. The first blade 92 is provided with a recess 92a for guiding the lead wires L, which recess 92a is further composed of a pair of rectangular positioning recess portion 92b parallelly formed with a distance equal to the distance between one pair of the guide grooves, A to K, on the chuck 32, i.e., 1.5, 2.0, 2.5, 5.0, and 6.0 mm (standardized interlead-wire distance or gage), and a guiding recess portion 92c which is connected to the positioning recess portion 92b and diverging in width toward the opening thereof. The lead wires L are exactly positioned by this guiding recess 92a and then sheared between the bottom portion 92d of the positioning recess 92b and a slightly skewed cutting blade 93a of the second blade 93.

The component supplying means 8, provided with the lead wire cutter 91 having such a function, is shown in its essential part in FIGS. 13 and 14. The first blades 92, provided respectively with the lead wire guiding recess 92a, are attached, same in number to that of the reels 5, to the rotatable frame 4 of the magazine means 2, for being rotated accompanied by the rotation of the rotatable frame 4. The first blade 92 is secured to a mounting block 95, which is secured on the upper end of a pair of rods 94, which rods are, in turn, slidably fitted through a guide block 96 secured to the lower end of the rotatable frame 4. The pair of rods 94 are connected together at their lower end portion with a connecting member 97, and are constantly biased downwardly by a compression spring 98, which urges the connecting member 97. The connecting member 97 concurrently functions as a mounting member for a roller 99. On the rotatable frame 4 are mounted tape feeding means (not shown) composed of a driving sprocket 101 for intermittently shifting the tapes T retaining electronic components W and a driven sprocket 102, same in number as the reels 5. This tape feeding means are rotated with the blade 92 accompanied by the rotation of the rotatable frame 4. The above description will clarify the construction of the movable portion 8b of the component supplying means 8. The movable portion 8b of the component supplying means 8 is actuated by a common actuating means disposed on the main body 1 side, without possessing any specific actuating means for itself. When the movable portion 8b has taken an agreeable position against the stationary part 8a of the component supplying means 8 a bell crank 103, in FIG. 13, pivoted on the main body 1 is clockwise rotated, by an actuating means (not shown) which includes a cam, to push upwards overcoming the elasticity of the compression spring 98 the roller 99, the connecting member 97, the rods 94, the mounting block 95, and the first blade 92. The stationary or fixed portion 8a of the component supplying means 8 is composed of the second blade 93, for shearing lead wires L in cooperation with the first blade 92, and an actuating means therefor attached on the side of the main body 1.

The second blade 93 is secured with a bolt to a mounting block 105 fixed to the lower end of a rod 104, which is slidably retained by a guide block 106 secured to the main body 1. On the upper end of the rod 104 is secured a block 107; a roller 108 pivoted on this block 107 is being fitted in a U-shaped recess 109a formed on one end of a bell crank 109, which is pivoted on the main body 1. When the bell crank 109 is rotated, clockwise or counter-clockwise in FIG. 13, by an actuating means including a cam, the block 107, the rod 104, and the second blade 93 are raised upwards or pushed downwards. The second blade 93 and other members connected thereto are prevented from a rotation about the vertical axial line in FIG. 13, because a rod 111 secured to the block 107 is paralelly fitted through the guide block 106 to the rod 104. As shown in FIG. 14 on the mounting block 95 for the first blade 92 is attached a supporting member 112; and on the mounting block 105 for the second blade 93 is attached a pusher 114, which is constantly biased downwardly by a compression spring 113. These members 112 and 113 serve, when the lead wires L are sheared by the cutter 91, to strengthen the chucking force of the chuck 32 by pinching the same from opposite sides upper and lower in order to prevent the lead wires L from getting out of place.

The drawing-in mechanism 17 will be described next, which is a means for further deeply draw in the lead wires L inserted by the turret loader 9 in the inserting holes in the p-c-b P. This mechanism 17 is, as shown in FIG. 15, positioned in confrontation, holding a p-c-b P inbetween, with the chuck 32 halted at the inserting posture (the lowest position in this embodiment).

The drawing-in mechanism 17 is provided with a movable rod 123 of quadrangular prism form retained axially (up and down in FIG. 15) slidablly by a guide block 122, which is secured to the main body 1. On the tip of the movable rod 123 is attached a pair of drawing-in pinchers 126 composed of a stationary or fixed pawl 124 and a movable pawl 125. The stationary pawl 124 is, at its foot portion 124a, of H-shape in section, as shown in FIG. 16. At a recess formed on the left side of the H-shape, the stationary pawl 124 is threadedly fixed to the movable rod 123, in close engagement with a recessed portion formed on the tip of the movable rod 123. The movable pawl 125 is, on the other hand, secured to an oscillating arm 128 which is pivoted, with a pin 127, on the movable rod 123. The oscillating arm 128 is a yoke-shaped member as shown in FIG. 17, and is pivoted, with its bifurcated portion 128a straddling the movable rod 123, thereto. The movable pawl 125 is, at its foot portion 125a, threadedly fixed on the tip of the bifurcated portion 128a of the oscillating arm 128; it is larger in width at its foot portion 125a than at the end portion 125b and is extending, as shown in FIG. 16, upward, with the end portion 125b passing through the right side recess of the foot portion 124a of the stationary pawl 124. The oscillating arm 128 is, at the opposite end from one end where the movable pawl 125 is secured, connected with a pin 129 to one end (upper end in FIG. 15) of an operation rod 131, in other end of the operation rod 131 being connected, with a pin 132, to a lever 133. The lever 133 is pivoted on a supporting shaft 134 which is secured to the main body 1, and on the other hand connected, through a connecting rod 130, to an oscillating lever which is oscillated by a cam (not shown). The lever 133 is oscillated, according to the rotation of the cam, at a preset time by a preset angle to move the operation rod 131 in a substantially parallel direction to the reciprocal direction of the movable rod 123 (up and down in FIG. 15). When the operation rod 131 is moved upwards, the force directed upwards will be delivered, via the oscillating arm 128, even to the movable rod 123; the latter 123 is, however, restricted from the upward movement, owing to a preset frictional force between the movable rod 123 and the guide block 122 generated by the elasticity of a pair of compression springs 135 abutted on one side of the movable rod 123. So long as the oscillating arm 128 can be rotated about the pin 127, the movable rod 123 will not be raised. Therefore, when the operation rod 131 is moved upwards, the oscillating arm 128 is clockwise (in FIG. 15) rotated first accompanied by the same directional rotation of the movable pawl 125. And the maximum possible rotation angle of the movable pawl 125 is limited by a stopper plate 136 threadedly fixed to the foot portion of the stationary pawl 124a. As soon as the movable pawl 125 abuts on the stopper plate 136, the movable rod 123 begins to move upwards overcoming the above-mentioned frictional force.

Likewise the operation rod 131, when moved downwards, causes the oscillating arm 128 and the movable pawl 125 to counterclockwise rotate; and the movable rod 123 does not begin to move until the movable pawl 125 abuts the stationary pawl 124. A simple up-and down motion of the operation rod 131 makes a cycle of all necessary steps for drawing-in of the lead wires L, i.e., opening, rising, closing, and descending of the drawing-in pinchers 126.

On opposite sides of the above described drawing-in mechanism 17, as shown in FIG. 15, is disposed a clinching mechanism 18 for clipping or shearing the lead wires L, which have been drawn in by the drawing-in mechanism 17, at an appropriate length and bending the same so as to make them substantially parallel to the back surface of the p-c-b P. The clinching mechanism 18, which shears and bends the lead wires L for preventing the same from getting out of place, includes a stationary blade 141 and a movable blade 142.

The stationary blade 141 is secured, with an ordinary fastening means such as bolting, to the tip of a blade retaining bar 143. A first cutter member consisting of the stationary blade 141 and a blade retaining bar 143 is slidably, upwardly slanting with the right end up, retained by a guide block 144 secured to the main body 1. Via a lever 146, which is pivoted on a supporting shaft 145 secured to the main body 1, this first cutter member is lengthwise reciprocated due to an actuation by a not-shown operation means, which means that the stationary blade carries out a shearing action while stationary and, does not necessarily mean that it is a completely fixed blade. A movable blade 142, which cooperates with the stationary blade 141 in shearing the lead wires L, is divided into three small bladelets by dividing planes perpendicular to the cutting edge thereof, as shown in FIGS. 18 and 19, 142L, 142C, and 142R, each of these being secured to the tip of respective blade retaining bars 147L, and 147C, and 147R with an ordinary fastening means such as bolting. These blade retaining bars 147L, 147C, and 147R pass through a guide block 148, or retaining member slantingly with their left end up, which guide block 148 is seucred to the main body 1, and are respectively pivoted, at their end portions (lower), to a movable member 149 for constituting a second cutter member. The movable member 149 is composed, as shown in FIG. 18, of a quadrangle prism portion 149a, a foot portion 149b, and a yoke portion 149c. The quadrangle prism portion 149a is slidably fitted in a guide bore 148a in the guide block 148; the yoke portion 149c is connected to a lever 151. When the lever 151 is rotated about a supporting shaft 152, actuated by a not-shown operating means, the movable member 149 is lengthwise reciprocated. On the foot portion 149b of the movable member 149 blade retaining bars 147L, 147C, and 147R are respectively pivoted with a pins 153L, 153C, and 153R. A guide bore 148b formed in the guide block 148 is slightly larger in width, as shown in FIG. 19, then the width which just allows accommodation of the blade retaining bars 147L, 147C, and 147R, so it is possible for the three blade retaining bars to rotate slightly respectively about the pins 153L, 153C, and 153R.

In the guide block 148 is formed another guide bore 148c, therethrough a substantially quardrangle-prism-shaped operation rod 154 being fitted slidably. At the lower end of the operation rod 154, a yoke portion thereof 154c is connected to a lever 155 for being lengthwise reciprocated, actuated by a not-shown operating means through the lever 155. At the upper end thereof (in FIG. 18), a pair of links 156 and 157 are pivoted by a pin 158. The other end of the links 156 and 157 are respectively connected with a pin 159 and a pin 161 to the blade retaining bars 147L and 147R in the vicinity of the upper end portion thereof (free end).

On the side of the blade retaining bars 147L and 147R confronting to the blade retaining bar 147C, are respectively formed three bores 147a and 147b, each having a bottom, on each side. In each of these bores 147a and 147b is air-tightly fitted a piston 162, 163 respectively, to form an air-cylinder by sliding reciprocation movement therein. These bores 147a and 147b are respectively connected, via passages 147c, 147d and pipings 164, 165, to an electro-magnetic valve 166. By means of switching of the electro-magnetic valve 166 the bores 147a and 147b are selectively supplied from an air source with compressed air.

The stationary blade 141 has, on its upper end portion, a recess 141a, formed at a lower side thereof as shown in FIG. 20, the extreme edge thereof being denoted as a cutting edge 141b; on either depending portion of the recess 141a is respectively formed and slantingly recessed portion 141d for facilitating engagement with the bladelets 142L and 142R.

On the tip portion of the bladelets 142L, 142C, and 142R are formed, as shown in FIG. 21 in enlargement, surfaces 142a, 142b, and 142d parallel to the back (lower) side Pb of the p-c-b P. On these surfaces are formed V-shaped grooves A', B', C', D', E', F', G', H', J', and K', at the position shown in FIG. 21, in the perpendicular direction to the blade edge of the bladelets 142L, 142C, and 142R. These grooves, A' to K', are arranged such that by taking A' on the bladelet 142L as a base C', D', E', J', and K', are respectively located at positions 1.5, 2.0, 2.5, 5.0, and 6.0 mm distant therefrom, and conversely, taking K' on the bladelet 142R as another base, H', G', F', B', and A' are similarly located at a position 1.5, 2.0, 2.5, 5.0, and 6.0 mm distant therefrom. All of these gauges are respectively agreed with the standard gauges (pitches) of the lead wire inserting holes in the p-c-b P. As a result of this, on the blade edge of each bladelet 142L, 142C, and 142R the same number of V-shaped recesses are formed. Such a construction of the movable blade 142 is aimed at bending of the lead wires L in widely divergent directions to each other, as shown in FIG. 22, and at the same time adapting to the construction of the chuck 32, wherein lead wires L can be held selectively at rightwards biased positions or leftwards biased positions, which will be further described with respect to the operation of the machine.

As to how the inserting operation of the lead wires L of components W is carried out, an example in which components $W_1$, $W_2$, $W_3$, $W_4$ are planted in a layout shown in FIG. 23 will be described, with reference also to FIGS. 24–33.

First of all a component $W_1$ is inserted at the upper right corner (in FIG. 23) of the p-c-b P, the lead wire distance (gage) being assumed to be 1.5 mm. Under the command of the control panel 6, the rotatable frame 4 of the magazine means 2 is rotated, and the reel 5 which retains the component $W_1$ is moved to the component supplying position. The first blade 92 disposed on the movable part 8b of the component supplying means 8 is halted at a position where the positioning recess portion 92b of the recess 92a for guiding just agrees with the V-shaped grooves K, H on the chuck 32 of the turret loader 9. When the sprocket 101 is rotated by a preset angle, the lead wires L of the component $W_1$ come to stop above the first blade 92, followed by lifting of the first blade 92 to guide the lead wires L into the recess 92a for guiding (as shown in FIG. 12 and in FIG. 24) and to exactly position the same in the V-shaped grooves H, K on the chuck 32.

Being caused by the retraction of the rods 72 and 74, the rod 27 is retracted owing to the restoring force of the compression spring 44 (refer to FIGS. 4 and 7). The chuck 32 which has been rested in an immediately neighboring position of the first blade 92 is closed for holding the middle portion of the lead wires L as shown in FIG. 25. The second blade 93 is then lowered to shear the lead wires L with cooperation of the first blade 92, see FIG. 25. At this time the lead wires L receive a rightward drawing force (in FIG. 25), however, the chuck 32 holds strongly enough the lead wires L to prevent the movement thereof, being pressed and reinforced of holding force by the supporting member 112 and the pusher 114, relative to the chuck 32. This mechanism for strengthening the holding force will further serve, in cooperation of the drawing force, to straighten the lead wires L. When the lead wires L have been clipped, the rods 71, 73 are retracted accompanied by the retraction, aided by the restoring force of the compression spring 35, of the rod 28. The chuck 32 is also retracted, with the lead wires L being held intact at the middle portion thereof as shown in FIG. 26.

Then the index table 2 is rotated by 45° to move the chuck 32 to a south-east position shown in FIG. 4, lowered 45° in the right-hand side. The operation shaft 87 will, in turn, be rotated, followed by a clockwise rotation of the lever 86, in FIG. 4, secured to the operation shaft 87, to push back the projected portion of the lead wires L from the tip of the chuck 32 within the tip level thereof, as shown in enlargement in FIG. 27.

Then the clutch releasing lever 82 is rotated by the push rod 83, and the piston 51 of the clutch means 47 is pushed into the clutch body 49 overcoming the spring force of the compression spring 52 to release the clutch means 47. The push rods 75, 76 are operated to urge, via the compression spring 78 and the pusher 77, the connecting block 46, causing advance of the same 46, the rod 29, and the pusher head 45, until the pusher head 45 finally abuts the head H of the component $W_1$, see FIG. 28. As a result of this, reaction force acted on the cylindrical pusher 77 from the connecting block 46 is rapidly increased to overcome the set load of the compression spring 78. Contraction of the compression spring 78 triggered in this way restricts the advance of the cylindrical pusher 77, the connecting block 46, the rod 29, and the pusher head 45, irrespective of the advance of the push rod 76. At this state the clutch releasing lever 82 is restored to the original position to connect the clutch means 47, the pusher head 45 consequently being kept connected to the connecting block 48, with the tip thereof abutting the head H of the component $W_1$. Afterwards the index table 22 is rotated again by 45° accompanied by the advance of the chuck 32, i.e., the push rod 64 begins to operate soon after the beginning of the rotation of the index table 22 to advance the rod 28, so the chuck 32 advances in the radial direction of the index table 22, while rotating with the index table 22, to approach the p-c-b P which is retained at a preset position by the positioning means 13 (refer to FIGS. 1 and 29). The p-c-b P is placed in a tangential direction to a circle A, concentric with the index table 22; and the chuck 32 is so operated as to halt at the most advanced position immediately before the halting of the index table 22. Thus the chuck 32 actually moves substantially parallel to the surface of the p-c-b P in the vicinity of a targeted position. The chuck 32 is approached, as shown in FIGS. 23 and 29, from a direction marked with arrow R to the targeted lead wire inserting holes Pa and halted exactly above the same holes Pa.

When the chuck 32 has halted exactly above the targeted position, the push rods 65, 66 begin to operate to advance the pusher head 45 by the distance, which equals to the travelling distance of the chuck 32 plus the length the lead wires to be protruded from the tip of the chuck 32, for pushing down the component $W_1$, as shown in FIG. 30. The lead wires L are subsequently protruded out of the chuck 32, overcoming the frictional force, to be inserted from their tip portion into the lead wire inserting holes Pa in the p-c-b P, wherein the lead wires L, being guided by the V-shaped grooves K, H formed on the stationary pawl 36, can be protruded straightly.

As shown in FIG. 30, the moment when the tip portion of the lead wires L are protruded, as far as the back side of the p-c-b P, to be between the already opened drawing-in pincers 126, the lever 133 is rotated counterclockwise (in FIG. 15) to pull down the operation rod 131, whereby the oscillating arm 128, in turn, counterclockwise rotates the movable pawl 125 to close the drawing-in pinchers 126 for holding the tip portion of the lead wires. Further downward motion of the operation rod 131 causes a downward motion, overcoming the frictional force, of the movable rod 123, which makes the drawing-in pinchers 126 come down, with the lead wires L held therein, to the sufficient deep position as can be seen in FIG. 31. At this time, the pusher head 45 is already retracted (upwards) and the chuck 32 is open. When the lead wires L are fully drawn in, the lever 146 (in FIG. 15) is rotated by a not-shown operation means including a cam to advance the stationary pawl 141 toward the back (lower in FIG. 15) surface Pb of the p-c-b P to be halted at a preset position. Soon afterwards, the levers 151, 155 are simultaneously rotated by a same angle to advance the movable member 149 and the operation rod 154, accompanied by a simultaneous and parallel advancing of the blade retaining bars 147L, 147C, and 147R, which are respectively pivoted at the end portion (lower portion) thereof to the movable member 149 and connected at the tip portion (upper portion) thereof to the operation rod 154, via the links 156 and 157. The bladelets 142L, 142C, and 142R fixed respectively on the tip of the blade retaining bars 147L, 147C, and 147R approach the back surface Pb of the p-c-b P from a slant direction, in a manner as if they were an integral cutter, to shear the lead wires L, with the aid of the stationary blade 141. The bladelets 142L, 142C, and 142R are, after having sheared the lead wires L, further advanced deep into a triangular space formed between the p-c-b P and the stationary blade 141, to bend the lead wires L along the back surface Pb of the p-c-b P. The operation rod 154 is then moved faster than the movable member 149, owing to the construction mode of the operation means, which will cause a relative movement of the pin 158 to the pins 159 and 161. The distance between the pin 159 and the pin 161 is to be enlarged to consequently rotate the blade retaining bars 147L and 147R respectively about the pin 153L and 153R at a same angle but in opposite directions away from each other. As the lead wire distance of the component $W_1$ is being assumed to be 1.5 mm, the lead wires L, which have been held and inserted by the grooves K, H of the chuck 32, are to be sheared at the V-groove K' on the bladelet 142R and the V-groove H' on the bladelet 142C (V-grooves K', H' are formed at the confronted position to that of the V-grooves K, H on the chuck 32). The electro-magnetic valve 166 is then already switched to a direction in which air is supplied to the piping 165, which causes the blade retaining bar 147C to be urged, by the pistons 163, to the side of the blade retaining bar 147L. It means that the blade retaining bar 147C is rotated in the same direction as the blade retaining bar 147L, when the blade retaining bars 147L and 147R are rotated in the opposite directions from each other. From the above it is easily understood that blade retaining bars 147R and 147C are split apart, and the bladelets 142C and 142L are moved leftwards and the bladelet 142R is moved rightwards, in FIG. 19, consequently the distance (gage) between the V-shaped grooves H' and K' is increased, and as a result, the lead wires L which are guided by these two grooves will be bent in a fanwise divergent direction by the angle $\theta$, as shown in FIG. 22. And this angle $\theta$ is to be determined at will by means of changing the ratio between the advancing speed of the bladelets 142L, 142C, and 142R and the divergent speed (a moving speed in the perpendicular direction against the advancing direction).

The reason why the lead wires L are, in addition to the pushing down by the pusher head 45 on the head H of the component $W_1$ for inserting into the lead wire inserting holes, drawn in by the drawing-in pinchers 126 lies in, as can be understood in the above description, prevention of buckling of the lead wires L while inserting and exact adaptation of the lead wires' position to that of the V-grooves A' to K' on the movable blade 42. As the lead wires L are, in this embodiment, held by the drawing-in pinchers 126, the moment the tip portion thereof protrude slightly through the lead wire inserting holes Pa, and drawn downwards straightly, i.e., in a perpendicular direction to the p-c-b P, so they are in an upright posture, parallel to each other with the same distance as that between the lead wire inserting holes Pa in the p-c-b P, spanned between the p-c-b P and the drawing-in pinchers 126. The lead wires L are, therefore, sheared exactly at the position of the V-shaped groove H' of the bladelet 142C and that K' of the bladelet 142R, and subsequently pressed to be surely bent in the divergent direction, as the grooves H' and K' diverge in accordance with the diverging of the blade retaining bars driving the bladelets 142R and 142L, as mentioned above.

When the bending or clinching of the lead wires L has been finished, and the stationary and movable blades 141, 142 have been restored to the original position distant from the p-c-b P, the control panel 6 gives a commanding signal to the p-c-b P to be positioned for the next inserting operation.

In the above-mentioned one cycle of the insertion, the component $W_1$ is finished of planting in the upper-right corner of the p-c-b P, as shown in FIG. 23.

While the component $W_1$ is inserted in the p-c-b P in such a manner, a second component $W_2$ is held in the next chuck 32 and a third component $W_3$ is likewise held in the third chuck 32.

Assume the lead wire distance of the component $W_2$ is 6 mm, then the first blade 92 having the positioning recess portion 92b of the same distance 6 mm is disposed beneath the reel 5 retaining the component $W_2$ of the magazine means 2, which positioning recess portion 92b is to be halted at a position just confronting to the V-shaped grooves A, K on the chuck 32 of the turret loader 9. The lead wires L of the component $W_2$ positioned by the first blade 92 are held by the chuck 32 at the V-shaped grooves of A, K, and cut off the tape T by the descending of the second blade 93 for being inserted, in the same mode as the component $W_1$, into the inserting holes Pa of the p-c-b P.

The lead wires L inserted are drawn in deeper by the drawing-in pinchers 126 and sheared or cut at the position of the V-shaped groove A' on the bladelet 142L and at that K' on the bladelet 142R. The lead wires L are, likewise in case of $W_1$, bent in divergent direction due to the advance of the bladelets 142R and 142L while being separated from each other. Furthermore, a component $W_3$ with the gage of 5.0 mm is held by the chuck 32 at the position of the V-shaped grooves A, J for being positioned, from the direction marked with the arrow M, right above the inserting holes Pa, as shown in FIG. 23 (the p-c-b P is positioned in compliance with such a situation).

The lead wires L inserted into the inserting holes Pa and drawn in by the drawing-in pinchers 126 are sheared at the position of the V-shaped groove A' on the bladelet 142L and that J' on the bladelet 142C, for being bent. The electromagnetic valve is then, by a commanding signal from the control panel 6, already switched to supply compressed air through the piping 164. So when the blade retaining bars 147L and 147R are split or separated from each other, the blade retaining bar 147C is urged by the pistons 162 to rotate in the same direction as the blade retaining bar 147R, which separates the bladelet 142L and the bladelet 142C from each other. The lead wires L, which are in captivity of the V-shaped groove A' on the bladelet 142L and that J' on the bladelet 142C, will be, likewise in case of $W_1$ and $W_2$, bent and clinched in the fanwise divergent direction.

The component $W_4$ with the gage of 2.5 mm is to be held by the chuck 32 at the V-shaped grooves F and K for being inserted at the position shown in FIG. 23. The chuck 32 is then advanced, with the stationary pawl 36 ahead, in the direction marked with the arrow N in FIG. 23 and FIG. 33, so the same 32 is allowed to approach the inserting holes while pushing away the already planted component $W_1$ on the p-c-b P indicated with a two-dot-chain line in FIG. 33, from the space wherein the component $W_4$ is to be inserted with the back (outer side) of the stationary pawl 36. It makes the distance between the holes where the component $W_1$ being inserted and the holes where the component $W_4$ is to be inserted extremelly small, which allows, in other words, to enhance the component distribution density. The chuck 32 in this embodiment is provided with a stationary pawl 36 so designed as to be as thin and straight as possible. It makes possible to make the distance between the components $W_1$ and $W_4$ far smaller than that in the conventional cases; besides the concept that the stationary pawl 36 pushes away the head H of the already planted component $W_1$ with the outer side thereof, when inserting another component $W_4$ in the immediate neighboring area, allows the distance between the components $W_1$ and $W_4$ to be minimized even to a state wherein $W_1$ and $W_4$ are in contact with each other. As can be understood from the above description, the chuck 32 is used, when holding a component W, at a pair of rightwardly biased V-shaped grooves (in case of $W_1$, $W_4$) or at a pair of leftwardly biased V-shaped grooves (in case of $W_3$), in accordance with the situation of the p-c-b P. When the lead wire gage is the greatest ($W_2$) the component is held exceptionally at the V-shaped grooves positioned centrally, which should be regarded as a special case of the principle of holding biasedly to either side.

As can be seen in FIG. 23, when the component $W_3$ is inserted, the p-c-b P shall be positioned in advance such that the already planted component $W_1$ comes around to the left (upper in FIG. 23) of the left-side extremity of the chuck 32, which is working at the leftwardly (upper in FIG. 23) biased pair of grooves for holding the component $W_3$. When the component $W_4$ is inserted, the p-c-b P is positioned such that the already planted component $W_3$ comes around to the right of the right-side extremity of the chuck 32 which is working at the rightwardly biased pair of grooves for holding the component $W_3$. By means of positioning the p-c-b P such that an already planted component is always confronted to the side of the chuck 32, on which the biasedly used pair of grooves on the chuck 32 are sided for holding a component-to-be-inserted, it has become possible to insert components at a very high distribution density regardless of the size of the chuck 32. In other words, the chuck 32 shown by a two-dot lined rectangular in FIG. 23 holds a component always at a pair of grooves biased to either one side, and the other side (not-holding the component) is always kept directed to the unplanted area of the p-c-b P. Disadvantages of traditional inserting method and apparatus, which had to take a wide space between components-to-be-inserted in accordance with the circumstances around the inserting apparatus or machine, have been completely eliminated.

The above-mentioned embodiment is only an example of this invention. Many variations and modifications are practicable without departing from the spirit and scope of this invention. Some of the examples will be disclosed hereunder.

Contrary to the above embodiment, wherein the chuck 32 is composed of a stationary pawl 36 and a movable pawl 39, the former being comparatively small in size, and the same is usable by, for holding a component, biasing the base to either one side, a chuck of symmetrical form against the chucking surface is also practicable such as one having a pair of pawls openable to either side, wherein holding of the component biased exclusively to one fixed side is possible.

Secondly in the above first embodiment a plurality of chucks 32 are disposed circumferentially around the index table 22, so a series of inserting operations of a component is divided into a plurality of steps for economizing the time required for inserting a component. Besides, the chuck 32 is approached to the p-c-b P.

utilizing the rotation movement of the index table 22, it can be substantially parallelly moved to the surface of the p-c-b P when it comes to the nearest position to the p-c-b P, which enables the chuck 32 to push away the already planted components in order to effectively enhance the component distribution density. It is, however, possible to make a laterally movable member, on a horizontal guide rail, hold or grip a component-to-be-inserted.

It is not an absolute requirement to push away already planted components on the p-c-b P by the movement of the chuck 32; after the chuck 32 has been halted at the targeted position, the p-c-b P itself may be moved parallelly to the surface thereof to achieve the same object. As the p-c-b P is, as shown in FIG. 1 and FIG. 2, usually mounted on a member which is movable in any direction in a plane (even a rotation movement when required) for being positioned at a desired position, it is also practicable to push away the already planted components by the chuck 32, by means of utilizing this plannar movement of the p-c-b P for the purpose of positioning. The chuck 32 can also be approached to the targeted inserting holes, from the perpendicular direction against the surface of the p-c-b P, wherein the back (outer side) of the stationary pawl 36 must be made slanted. If the already planted components can be pushed away, by utilizing this slanted back surface of the stationary pawl 36, the object of enhancing the component distribution density is likewise attainable.

Various modifications are possible to be made about the structure of individual members. For example, a magazine means 2, wherein reels are parallelly retained to each other and they are fed by a linear movement one by one to the component supplying position, can be substituted for the first embodiment type in which reels are radially arranged on the circumference of the rotatable frame 4.

The cutter 91 in the component supplying means 8 functions concurrently as a positioning means for accurately positioning the lead wires L against the chuck 32, which enables indeed elimination of a particular actuating means therefor. It is, however, possible to dispose a proper separate positioning means such as a positioning plate having a guide recess.

The chuck 32 is not limited to the above-mentioned structure; any one type which is openable in a perpendicular direction to a plane including the two lead wires L for holding the same will do for the purpose.

In the above embodiment, the lead wires L are accommodated once within the chuck 32, and are, when having arrived at the targeted position, protruded out of it to be inserted into the inserting holes Pa. It indeed has a great advantage of avoiding scratching, or contacting with, other objects by the lead wires L while being moved, but it is not essential to this invention. If a chuck 32 satisfies such conditions that the protruded portion of the lead wires L can be minimized when a component W is held by the chuck 32, and the chuck 32 can be moved without letting the protruded portion of the lead wires L contact the p-c-b P, being retained within a distance from the p-c-b P capable of pushing away the already planted components W with the back side of the stationary pawl 36, it may be moved horizontally, i.e., parallelly to the surface of the p-c-b P until it reaches right above the targeted inserting holes Pa, followed by a perpendicular movement thereof to insert the lead wires L. In this case, disposition of the V-shaped grooves on the chuck 32 is not necessarily required. Rubber lining on the chucking surface of either or both pawls of the chuck 32 is preferable for ensuring the positioning of the lead wires L when being held. As to the open-and closing of the chuck 32, mechanical structure is not the only way, but employing other means such as electromagnetism or compressed air are also practicable.

When the lead wires L are pulled by the drawing-in pinchers 126, a simultaneous descending of the pusher head 45 at an identical speed is also effective to be practiced. Even when the drawing-in pinchers 126 are by chance out of order for holding the lead wires L, they can be inserted deeply enough by the pusher head 45, which is good for enhancing the reliability of the apparatus.

It is also possible to carry out the insertion with only a pusher head 45 or a chuck 32, eliminating the drawing-in pinchers 126.

Regarding the clinching means 18 variations can also be made. The V-shaped grooves A'-K' formed on the bladelets 142L, 142C, and 142R need not necessarily be in a perpendicular direction to the blade edge, but may be formed with a certain angle slanted thereto. In this case, the lead wires L may be effectively prevented from getting out of the V-grooves even when they are being bent substantially parallel to the lower side (back side) of the p-c-b P.

When the width of the bladelets is large enough, or the angle $\theta$ formed between the lead wire bending direction and the shearing direction (see FIG. 22) is comparatively small, means for keeping the lead wires L in place or means for increasing the friction coefficiency is not necessarily indispensable.

The mechanism for separating the blade retaining bars 147L, 147C, and 147R from each other is not limited to the above-mentioned combination, as shown in FIGS. 15, 18, and 19, of the operation rod 154, the links 156 and 157, the pistons 162 and 163, the electro-magnetic valve, etc., but may be one shown in FIG. 35, wherein the operation rod 154 is eliminated and the divergent separation of the blase retaining bars 147L, 147C, and 147R are carried out by utilizing the forward movement thereof, although they pass, as in the first embodiment, through the guide bore 148b of the guide block 148 and pivoted respectively at their end portion (lower portion in FIG. 35) to the movable member 149 by the pins 153L, 153C, 153R for being lengthwise movable therewith. Between the end portion of the blade retaining bars 147L and 147R is mounted a tension spring 205 for constantly biasing them closed; between the blade retaining bar 147L and the blade retaining bar 147C, and between the blade retaining bar 147C and the blade retaining bar 147R are respectively formed an accommodating hole 206, 207 for being selectively fitted thereinto by a wedge-shaped member 208, 209 from the rear side, in order to regulate the moving direction of the three blade retaining bars. Three rollers 211L, 211C, and 211R, which are pivoted on the respective blade retaining bars 147L, and 147R, are advanced together with the three blade retaining bars to contact either of the wedge-shaped members 208, 209, which selectively come up into the accommodating holes 206, 207, when the three blade retaining bars are selectively separated between the blade retaining bar 147L and the blade retaining bar 147C or between the blade retaining bar 147C and the blade retaining bar 147R. Then the bladelets 142L, 142C, and 142R are imparted the identical movement as in the first embodiment. For selectively actuating the wedge-shaped members 208, 209, a combination of an air cylinder and an electromagnetic valve or a combination of a spring and an electromagnet, or the like may be preferably employed.

The movement of the blade retaining bars for separating the bladelets is preferably performed by a rotating type for simplifying the structure of the mechanism; but it is possible to achieve the same object by a parallel movement. The direction of the movement of the movable blade when clinching the lead wires is usually preferred to be, as in the above embodiments, a little slant against the back surface of the p-c-b for ensuring the clinching process; it is, however, possible to move it in a parallel direction to the back surface of the p-c-b P. An example thereof is illustrated in FIGS. 36 and 37. A stationary blade 214 is secured to an up-and downwards movable member 216 actuated by an air cylinder 215. Bladelets 217L and 217R (movable blades) are secured to the tip of rotating arms 221L and 221R respectively, which are pivoted on movable members 219L and 219R laterally moved by air cylinders 218L and 218R. On a guide bar 223 for guiding the movable members 219L and 219R is slidably disposed a stopper means 224 for restricting the movement range of the movable members 219L and 219R. This stopper means 224 is selectively moved to a right side position or to a left side position by a feeding thread 226 directly connected to a rotating shaft of a servomotor 225 which is secured to the up-and downwards movable member 216.

The bladelets 217L, 217R shear the lead wires L, in this embodiment, from a substantially parallel direction to the back (lower) side of the p-c-b P, when the rotating arms 221L, 221R are rotated by the air cylinders 222L, 222R; after the bladelets 217L, 217R have sheared the lead wires L they continue to move parallelly to the back side of the p-c-b P for bending the lead wires L as shown in FIG. 38 parallelly to the shearing direction and with a certain small angle α against the back side Pb of the p-c-b P. Afterwards, due to a separation of the movable members 219L, 219R from each other actuated by the air cylinders 218L, 218R, the bladelets 217L, 217R will be consequently separated from each other. The lead wires L, once bent parallelly to the shearing direction, are to be diverged outwardly with a certain angle, just like the arrangement shown in FIG. 22. In order to ensure the angle of the bending direction from the shearing direction in which the lead wires L are bent and diverged, it is also effective in this embodiment to form fine grooves or recesses 217a on the upper surface of the bladelets 217L, 217R, or to stick some material of high friction coefficient for preventing slipping or sliding of the lead wires L on the upper surface of the bladelets 217L, 217R.

When the lead wires L are inserted by being held at a rightwardly biased position of the chuck 32 the stopper means 224 is moved to a rightwardly biased position, and when vice versa, the stopper means 224 is moved to a leftwardly biased position, thereby adapting the operation position of the bladelets 217L, 217R to the position of the inserting holes of the lead wires L.

Even the clinching means 18 in FIG. 15 can be modified such that by making the guide block 148 movable in a parallel direction to that of the diverging movement of the bladelets the clinching means 18 itself may be adapted to the position change of the lead wires L, thereby reducing the number of bladelets and blade retaining bars to two each. For that it is required to allow a changing of relative position, due to the movement of the guide block 148, between the movable member 149, the operation rod 154 and the levers 151, 155, by means of taking some measures such as enlarging the width of the yoke portions of the movable member 149 and the operation rod 154 larger than the thickness of the levers 151, 155.

Contrary to the earlier described clinching of the lead wires L, wherein the same were bent in divergent directions, bending in convergent or in mutually approaching directions is also possible, where the lead wires L are bent inwardly directed as shown in FIG. 39. In that case the bladelets are made approach to each other, after the shearing has been finished, symmetrically and perpendicularly to the shearing direction.

Furthermore, a clinching means which simply bends and clinches the lead wires L without shearing them, or which simply squashes the tip portion of the lead wires L flat is possible.

What is claimed is:

1. An apparatus for mounting electronic components on a printed circuit board comprising:
   printed-circuit-board-positioning means for positioning a printed circuit board at a desired position for insertion of an electronic component at said position by means of moving said printed circuit board in a single plane;
   means for inserting the lead wires of said electronic components in lead wire holes formed in said printed circuit board at said desired position from the front side thereof, said inserting means including at least one chuck for holding one of the said electronic components at a time;
   a pair of blades positioned at the back side of said printed circuit board and mutually cooperable to shear the ends of said lead wires protruding out beyond the back side of said board after said lead wires are inserted,
   means for moving said pair of blades towards said printed circuit board to shear the protruding ends of said lead wires; and
   one of said blades being divided into a plurality of bladelets by at least one dividing plane substantially perpendicular to a cutting edge thereof;
   means for changing the distance between two of said bladelets in said one of said blades after the shearing of said protruding ends is complete, said distance changing means comprising means to cause said bladelets to move in planes parallel to the plane of said printed circuit board to thereby bend the remaining protruding portions of said sheared lead wires in different directions with respect to each other.

2. An apparatus as claimed in claim 1, wherein said distance changing means is a means for separating said two bladelets from one another to bend said remaining lead wires in mutually diverging directions.

3. An apparatus as claimed in claim 1, wherein said bladelets are disposed three or more in number and the distance changing means changes the distance between any selected adjacent two of said bladelets.

4. An apparatus as claimed in claim 1, wherein said chuck includes a pair of pawls open-and-closable in a perpendicular direction to a plane including axes of the lead wires of one of said electronic components and holds said component-to-be-inserted at the lead wires thereof.

5. An apparatus as claimed in claim 4, wherein at least one of said pawls is provided with plural pairs of parallel, formed (guide grooves), one groove of said each pair being located in the vicinity of one edge of the pawl and the other groove of said each pair being located distant from said one groove by a distance equal to one of a plurality of nominal inter-lead-wire distances of said electronic components.

6. An apparatus as claimed in claim 1, wherein said distance changing means comprising means to cause said two bladelets to approach each other to bend said remaining lead wires towards each other.

7. An apparatus as claimed in claim 1, wherein at least said one blade comprising said bladelets is formed with a plurality of pairs of grooves for receiving said lead wires and for bending said remaining protruding portions of said lead wires when said distance changing means causes bladelets to move with respect to each other.

8. An apparatus as claimed in claim 1, wherein said pair of blades approach the back side of said printed circuit board at acute angles to the plane of said printed circuit board which cause them to converge on said protruding ends of said lead wires to first shear said lead wires and then bend the remaining ends of said lead wires and to finally move said bent remaining ends in planes parallel to the plane of said printed circuit board when said distance changing means moves said at least two of said bladelets in said planes parallel to the plane of said printed circuit board.

9. An apparatus as claimed in claim 1, wherein said pair of blades approach the back side of said printed circuit board at acute angles to the plane of said printed circuit board to first shear said lead wires and then bend the remaining ends of said lead wires and to finally move said bent remaining ends in planes parallel to the plane of said printed circuit board when said distance changing means moves said at least two said bladelets in said planes parallel to the plane of said printed circuit board.

10. An apparatus as claimed in claim 1, wherein said inserting means further comprises a drawing-in means positioned on the other side of said printed circuit board from said chuck, said drawing-in means holding and drawing-in further the tips of said protruding lead wires towards the back side of said printed circuit board.

11. Means for shearing and clinching a pair of lead wires of an electronic component inserted into lead wire inserting holes in a printed circuit board, said means for shearing the protruding portions on the back side of said printed circuit board of said lead wires at a preset length and clinching the sheared remaining lead wires comprising:
a first blade having one cutter which is to be halted at a preset position, at least when the shearing operation is carried out, in the vicinity of the back surface of said printed circuit board;
a second blade, which is in cooperation with said first blade for shearing said pair of lead wires, and which is divided into two cutter portions by a plane substantially perpendicular to the blade and the cutting edge of the blade;
reciprication means for advancing and retracting said second blade toward said first blade; and
reciprocation means for advancing and retracting said second blade toward said first blade; and
symmetrical moving means for symmetrically moving said two cutter portions of said second blade in directions other than the direction of said reciprocation movement for clinching the remaining sheared ends of said lead wires.

12. An apparatus for shearing and clinching a pair of lead wires of an electronic component inserted into lead wire inserting holes in a printed circuit board comprising means for shearing the protruding portions on the back side of said printed circuit board of said pair of lead wires at a preset length and for clinching the sheared remaining lead wires comprising:
a first blade having one cutter which is to be halted at a preset position, at least when the shearing operation is carried out, in the vicinity of the back surface of said printed circuit board;
a second blade, which is in cooperation with said first blade for shearing said pair of lead wires and which comprises a plurality of bladelets defined by at least one plane substantially perpendicularly to the blade and the blade edge, said bladelets being individually secured to the free end of a plurality of bladelet retaining bars which are pivoted to one movable member such that they are movable substantially parallel to each other and rotatable within a small angle in one rotational plane;
a retaining member for retaining said second blade such that said rotational plane is inclined at a preset angle to said printed circuit board and said bladelet retaining bars are movable in lengthwise reciprocation;
reciprocation means for reciprocating said movable member such that said plurality of bladelet retaining bars are moved lengthwise; and
separation means, which is interlocked with said reciprocating means, for separating said plurality of bladelet retaining bars at a desired demarcation line thereamong and for rotating the bladelet retaining bar or bars on the other side in mutually reversed directions and at a substantially identical angles, whereby said bladelets secured to the tips of said bladelet retaining bars are separated in a direction other than the direction of said reciprocating movement to thereby perform said clinching of said sheared remaining lead wires.

13. A device claimed in claim 6, wherein said separation means comprises:
an operation rod reciprocated parallelly to the reciprocating direction of said movable member by a second reciprocation means, which is in interlock relationship with said reciprocation means;
a pair of links pivoted to said operation rod at one respective end portion and pivoted at the other end to a position near the free end of the two outermostly disposed bladelet retaining bars;
air cylinders disposed respectively between said bladelet retaining bars which function to separate any neighboring bladelet retaining bars in a mutually diverging direction; and
air supplying means for selectively supplying air to any one desired air cylinder or cylinders disposed between each of said retaining bars positioned side by side.

14. A device claimed in claim 6, wherein said separation means comprises:
a biasing means for urging two of the outermostly disposed bladelet retaining bars toward each other;
wedge-shaped means for selectively fitting into any one of accommodating holes formed between each of said retaining bars; and
positioned side by side, parallel thereto in order to guide the reciprocating movement of said bladelet retaining bars and separate the same, by means of wedging action, when said bladelet retaining bars have been advanced up to a preset position.

* * * * *